US011313889B2

(12) United States Patent
Reiman et al.

(10) Patent No.: US 11,313,889 B2
(45) Date of Patent: Apr. 26, 2022

(54) METHODS AND SYSTEMS FOR EVALUATING AND IMPROVING DISTRIBUTION-GRID OBSERVABILITY (71) Applicant: Battelle Memorial Institute, Richland, WA (US)

(72) Inventors: Andrew P. Reiman, Richland, WA (US); Jeffrey D. Taft, Washington, PA (US); Casey C. Neubauer, West Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 175 days.

(21) Appl. No.: 16/900,727

(22) Filed: Jun. 12, 2020

(65) Prior Publication Data

US 2021/0389356 A1 Dec. 16, 2021

(51) Int. Cl.
*G01R 22/10* (2006.01)
*H02J 13/00* (2006.01)

(52) U.S. Cl.
CPC ........ *G01R 22/10* (2013.01); *H02J 13/00002* (2020.01)

(58) Field of Classification Search
CPC .................. G01R 22/10; G01R 19/2513; H02J 13/00002; G06Q 50/06
USPC .......................................................... 702/61
See application file for complete search history.

(56) References Cited

U.S. PATENT DOCUMENTS 9,641,026 B2 * 5/2017 Boardman ........ H02J 13/00028
9,881,033 B2 * 1/2018 Boardman ............. G05B 15/02
2021/0392050 A1 12/2021 Taft et al.

OTHER PUBLICATIONS

"Lecture 9: Dijkstra's Shortest Path Algorithm", Retrieved at: https://mat.uab.cat/~alseda/MasterOpt/MyL09.pdf—on Mar. 19, 2021, 28 pages.
Benzi, et al., "Total communicability as a centrality measure", Journal of Complex Networks, vol. 1, Issue 2, https://doi.org/10.1093/comnet/cnt007, Dec. 2013, pp. 124-149.

(Continued)

*Primary Examiner* — John H Le
(74) *Attorney, Agent, or Firm* — Colby Nipper PLLC (57) ABSTRACT

This document describes systems and techniques for evaluating and improving distribution-grid observability. These systems and techniques allow engineers to quantify the observability of a distribution grid, which represents an ability to combine actual measurements and various types of computations (e.g., analytics, estimators, forecasters), from a system model. Distribution engineers can also identify islands of observability where operating parameters, including voltages, currents, and power flows, can be determined from available sensor readings. By exclusion, distribution engineers can similarly identify areas of the distribution grid with observability deficiencies that may require additional instrumentation to maintain proper operation. Distribution engineers, using an iterative or automated process, can determine the observability of the system model with new or relocated sensors to generate a sensor allocation plan. The sensor allocation plan can indicate the number and location of sensors to either maximize observability for a fixed sensor cost or minimize sensor cost for predetermined observability.

20 Claims, 6 Drawing Sheets

(56) References Cited

OTHER PUBLICATIONS

Taft, "Connectivity, Centrality, and Bottleneckedness: On Graph Theoretic Methods for Power System", Jan. 30, 2020, 27 pages.
Slutsker, et al., "Network Observability Analysis Through Measurement Jacobian Matrix Reduction", IEEE Transactions on Power Systems, vol. PWRS-2, No. 2; Control Data Corporation, May 1987, 6 pages.
Taft, et al., "Determining Distribution Grid Stage Coverage Computationally", Grid; Modernization Laboratory Consortium; U.S. Department of Energy; PNNL-29338, Nov. 2019, 14 pages.
Taft, et al., "Extended Grid State Definition Document", Grid; Modernization Laboratory Consortium; U.S. Department of Energy; vol. 3.3, Feb. 2019, 35 pages.
Taft, et al., "Sensing and Measurement for Advanced Power Grids", Cisco Systems and Caltech Resnick Institute; Version 1.3, Oct. 22, 2012, 34 pages.

\* cited by examiner

METHODS AND SYSTEMS FOR EVALUATING AND IMPROVING DISTRIBUTION-GRID OBSERVABILITY

STATEMENT AS TO RIGHTS TO DISCLOSURES MADE UNDER FEDERALLY-SPONSORED RESEARCH AND DEVELOPMENT

This disclosure was made with Government support under Contract DE-AC0576RL01830 awarded by the U.S. Department of Energy. The Government has certain rights in the invention.

BACKGROUND

The integration of distributed energy resources in electrical grids is rapidly increasing. Distributed energy resources include, as non-limiting examples, rooftop photovoltaic inverters, megawatt-level photovoltaic farm inverters, smart thermostats, solar panels, and energy storage devices. For example, electric companies are installing more and more solar-power-producing devices and wind turbines to meet increased demand. Reductions in the cost of distributed energy resources, higher electricity prices, tighter environmental-impact regulations, and heightened sustainability concerns are driving this increased demand. Integrating distributed energy resources into legacy power systems is changing the operational dynamics of distribution grids. Distribution grids in the recent past did not require much instrumentation or many sensors to manage and operate. The increased prevalence of distributed energy resources has created new problems for distribution engineers in managing and controlling power flows in electrical grids, especially distribution grids.

Increased observability of the operation and performance characteristics of distribution grids is needed to solve these power-management problems. The need for increased observability also requires improved instrumentation. Distribution engineers are increasingly responsible for developing sensor allocation plans that can, for example, identify how many sensors to add to a distribution grid, the types of sensors to add, and the location of the new sensors in the distribution grid. While tools exist for managing the operation of balanced, three-phase transmission systems, design tools are not available to solve these sensor-allocation problems for distribution grids. As an example, the existing tools generally do not account for the unbalanced phases, topological complexities, or uncertainty associated with distribution grids. There is also a lack of systems and techniques to assess the instrumentation of a distribution grid quantitatively.

SUMMARY

This document describes systems and techniques for evaluating and improving distribution-grid observability. These systems and techniques allow distribution engineers to quantify the observability of a distribution grid, which represents an ability to combine actual measurements and various types of computations (e.g., analytics, estimators, forecasters), from a system model. Distribution engineers can also identify islands of observability where operating parameters, including voltages, currents, and power flows, can be determined from available sensor readings. By exclusion, distribution engineers can similarly identify areas of the distribution grid with observability deficiencies that may require additional instrumentation to maintain proper operation. Distribution engineers, using an iterative or automated process, can determine the observability of the system model with new or relocated sensors to generate a sensor allocation plan. The sensor allocation plan can indicate the number and location of sensors to either maximize observability for a fixed sensor cost and/or to minimize sensor cost for predetermined observability.

In some aspects, this disclosure describes a method for evaluating and improving distribution-grid observability. The method includes receiving a system model of the distribution grid. The system model provides a representation of circuits, sensors, and locations of the sensors within the distribution grid. The method determines, from the system model, non-redundant potential measurements and actual measurements of the distribution grid. The method then determines, by dividing the actual measurements by the potential measurements, a measurement fraction. The method also determines, by multiplying the measurement fraction by a transportability of the distribution grid, a model visibility of the system model. The model visibility is an index value representing a capability to obtain useable data. The method determines, by dividing estimated measurements by the potential measurements, an estimation fraction. The estimated measurements can be identified using symbolic algebraic substitution. Finally, the method determines, by multiplying the transportability by a sum of the measurement fraction and the estimation fraction, a model observability of the system model. Using the model observability or a system observability, which is the product of the model observability multiplied by a model validity of the system model, distribution engineers can generate a sensor allocation plan for the distribution grid.

This document also describes other configurations of, and systems for, evaluating and improving distribution-grid observability, as well as non-transitory computer-readable storage media to perform these methods.

This Summary is provided to introduce simplified concepts for evaluating and improving distribution-grid observability, which is further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects for evaluating and improving distribution-grid observability are described in this document with reference to the following drawings. The same numbers are used throughout multiple drawings to reference like features and components.

DETAILED DESCRIPTION

Overview

As distribution grids have become more complex, engineers have developed a definition of the grid state to assist in managing these systems. This definition allows system engineers and operators to relate sensor-measurement information (e.g., voltages, currents, power flows, and phase angles) to the grid state and to determine the operating status of a distribution grid. Because it is generally not practical to use a large number of sensors, an issue for managing distribution grids is determining how much sensor data is necessary and from where the sensor data should be collected. Engineers have developed definitions of visibility, transportability, and observability to assist in quantifying the grid state of distribution grids.

Transportability is the ability to transfer data from sensors to points of use. In other words, it quantifies the capabilities of the communication systems within and connected to distribution grids to deliver measurement data to distribution systems (e.g., Distribution Management System (DMS)) and/or distribution engineers. In some distribution grids, the transportability is less than ideal (e.g., less than an index value of 1.0) because it can be challenging to move measurement data from remote grid locations to points of use.

Visibility is the capability of a distribution engineer or a management system to obtain usable direct measurements of grid parameters. It generally involves two functions: taking sensor measurements at points in the distribution grid and transporting the measurement data to points of usage.

Observability is the ability to combine actual measurements in the distribution grid with system models and various types of computations (e.g., analytics, estimators, forecasters) to generate actionable estimated measurements. Observability introduces the concept of estimating grid-state information to supplement visibility. The estimated measurements may include grid-state information that may not have been directly sensed and may include processing to extract from actual measurements. In other words, the observability of a distribution grid is the ability to estimate a set of operating parameters (e.g., voltages, currents, current flow, power flows) from sensor readings. This definition allows system engineers and operators to evaluate how well grid-state parameters can be determined.

As described above, distribution engineers generally do not have design tools to assist with sensor allocation in distribution grids. In particular, distribution engineers lack systems and techniques to assess the instrumentation of a distribution grid in terms of transportability, visibility, and observability. The high nodal volume, lack of useful metadata, and a large number of unknowns (e.g., grid topology, availability of behind-the-meter distributed energy resources) make it challenging to apply conventional transmission-grid tools to distribution grids. Many distribution engineers have integrated additional sensors into distribution grids to address the increasing complexity of distribution grids and with grid-state management. The availability of new measurement data does not necessarily significantly improve grid transportability, visibility, and observability.

This document describes systems and techniques to quantify observability from a set of sensor measurements, which can be sparse in distribution grids. The observability determinations can be used to determine "islands of observability" of a distribution grid. Islands of observability represent regions of a distribution grid where operating parameters can be either measured or estimated. For example, grid management systems, with sufficient measured bus voltages, can determine other potential measurements within the island of observability. By exclusion, islands of observability define portions of the distribution grid where it is not possible to make such determinations. Distribution engineers can use these regions to identify observability deficiencies that require additional sensor measurements for proper grid operation.

The described systems and techniques can make use of relationships between sensors and grid parameters to increase observability. The systems and techniques can establish these relationships considering sensors and their placement in a system model of the distribution grid. The accuracy of the system model and the effectiveness of the communication system can be taken into account to determine zones where full observability is possible (e.g., islands of observability) and where, by exclusion, it is not. Distribution engineers can place sensors within the system model to automatedly recalculate the observability of the distribution grid. In this way, the described systems and techniques enable distribution engineers to allocate sensors in a distribution grid according to sensor-allocation strategies and to optimize sensor placement. For example, a distribution engineer can maximize observability for a fixed sensor cost and/or minimizes sensor cost for a target observability.

Operating Environment

Figure 1:
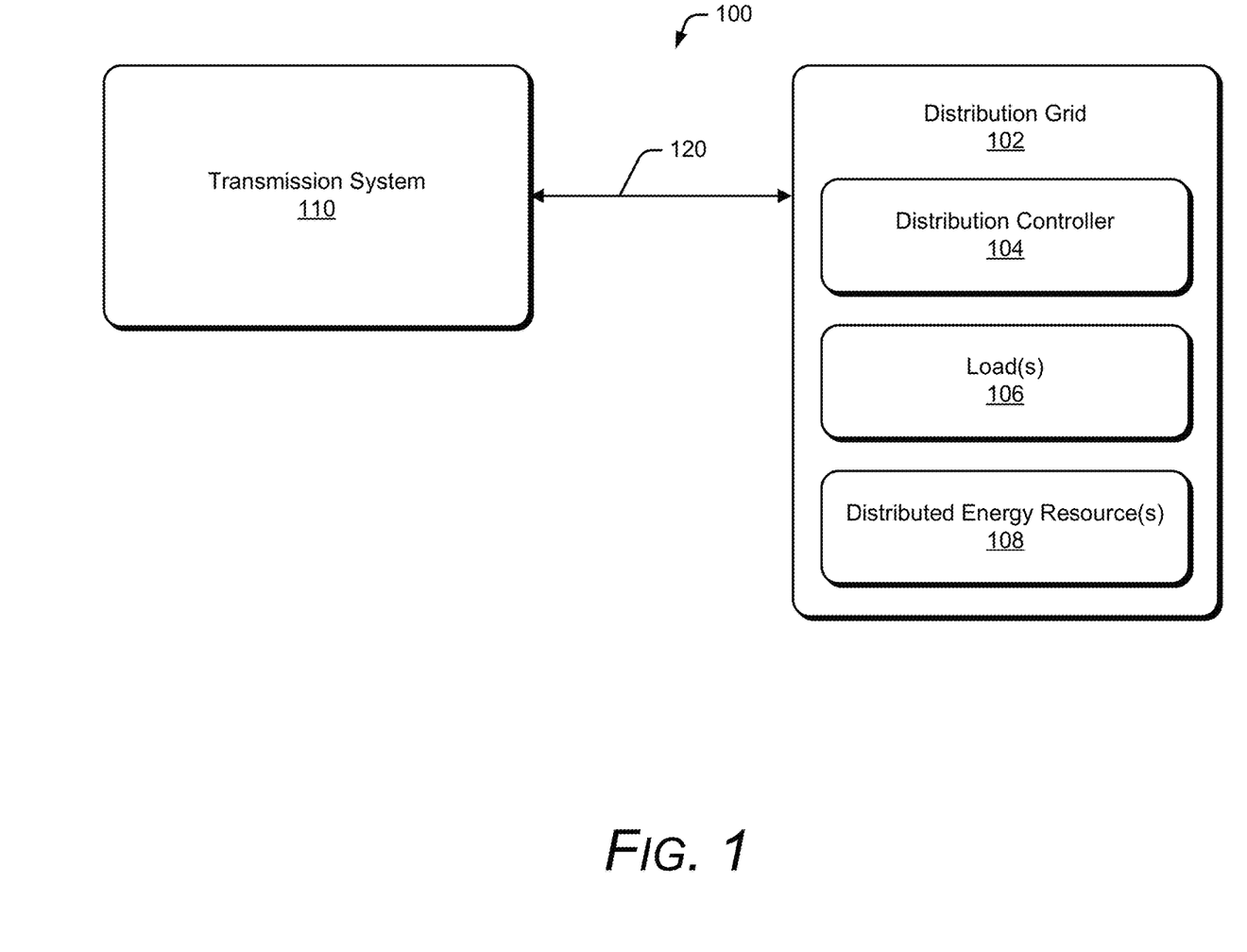
FIG. 1 is a schematic illustration of a system including a transmission system and a distribution grid.

FIG. 1 is a schematic view that illustrates a system 100 including a distribution grid 102 and a transmission system 110. As shown in FIG. 1, the transmission system 110 is connected to the distribution grid 102 via a connection 120 (e.g., overhead and underground transmission power lines). The distribution grid 102 can include a distribution controller 104 for controlling operations of the distribution grid 102, loads 106, and distributed energy resources 108.

The distribution controller 104 can be implemented as one or more processors or computing devices configured to execute operations associated with power management and distribution within the distribution grid 102. The distribution controller 104 can constitute respective modules that execute operations within a computing environment to provide power management and distribution services within the distribution grid 102. The distribution controller 104 can also include memory or other non-transitory computer-readable storage media encoded with instructions that, when executed by the one or more processors, perform power-management and distribution services.

The loads 106 represent commercial or residential distribution points within the distribution grid 102 for receiving adjusted electrical power from the transmission system 110. Examples of the loads 106 include residences, businesses, industrial consumers, government entities, and other consumers that rely on the distribution grid 102 for power.

The distributed energy resources 108 represent distribution feeders to the distribution grid 102. The distribution grid 102 can use the additional capacity provided by the distributed energy resources 108 to supplement adjusted power received from the transmission system 110 to power the loads 106. While primarily described as photovoltaic-type distributed energy resources (e.g., rooftop photovoltaic inverters, megawatt-level photovoltaic farm inverters), other examples of the distributed energy resources 108 exist. As some examples, the distributed energy resources 108 can include geothermal, hydroelectric, wind-based inverter units, and energy storage devices configured to provide electrical capacity to the distribution grid 102.

In operation, the transmission system 110 delivers electrical power to the distribution grid 102 via the connection 120. The transmission system 110 adjusts (e.g., step-downs, step-ups, frequency shifts, phase shifts) the electrical power for consumption by the distribution grid 102. The distribution controller 104 controls the distribution grid 102 to distribute the adjusted electrical power to the loads 106. The distributed energy resources 108 can inject additional electrical capacity into the distribution grid 102 to assist in powering the loads 106. The distribution controller 104 can control the distributed energy resources 108 to assist in powering the loads 106 given the adjusted electrical power.

Figure 2:
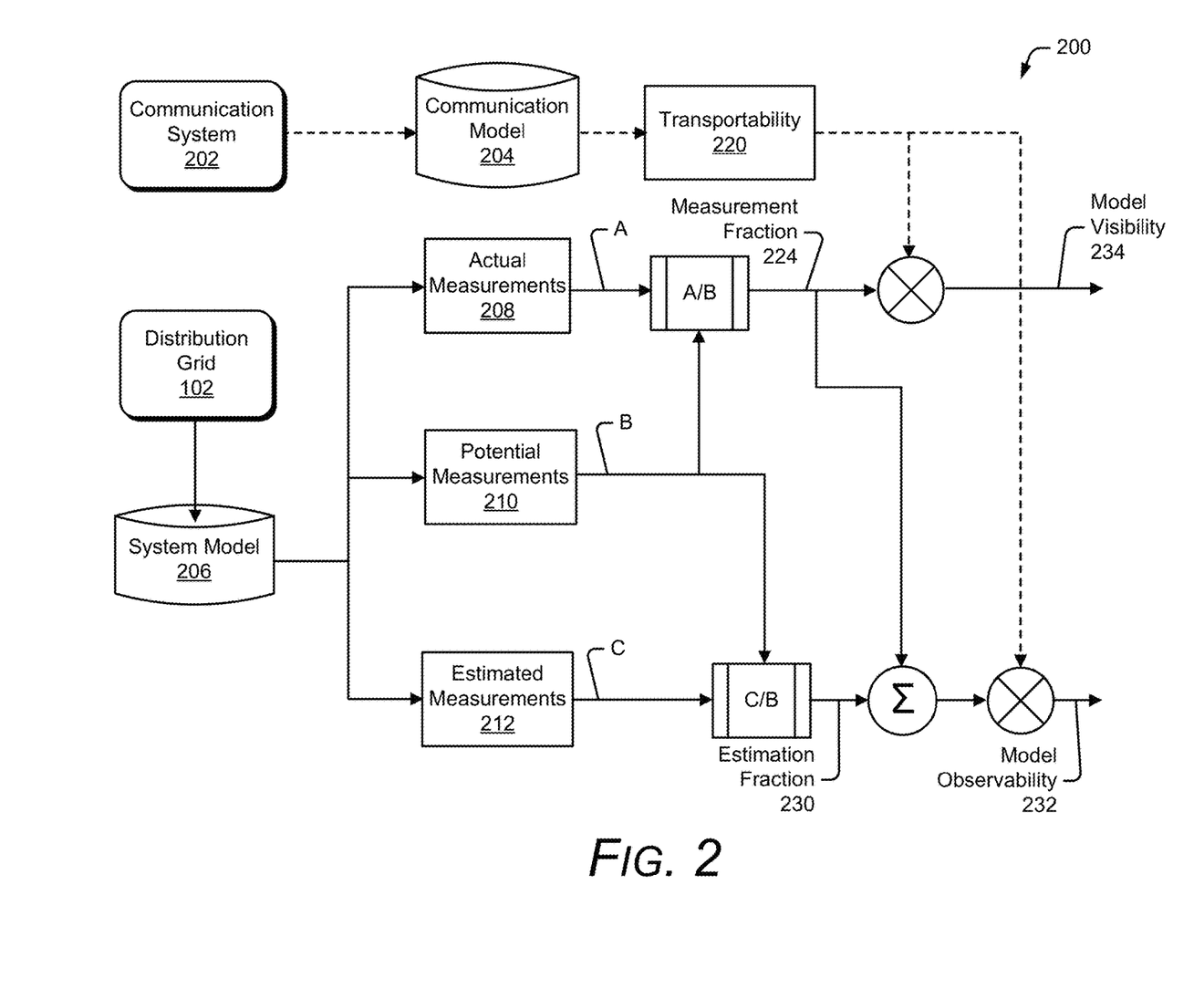
FIG. 2 is a high-level flow chart of a grid management system to evaluate and improve a model visibility and a model observability of a system model.

FIG. 2 illustrates a high-level flow chart of a grid management system 200 to evaluate and improve a model visibility 234 and a model observability 232 of a system model 206. The system model 206 provides a topological representation of the distribution grid 102. The system model 206 can represent all or a portion of the distribution grid 102.

The grid management system 200 begins with a communication model 204 and the system model 206. The communication model 204 provides information about a communication system 202 within and connected to the distribution grid 102. In some implementations, distribution engineers can omit the communication model 204 and estimate the efficacy of the communication system 202 within and connected to the distribution grid 102. The system model 206 includes a representation of circuits, nodes, buses, sensors, and sensor locations within the distribution grid 102.

Distribution engineers can use the grid management system 200 to generate several indices (e.g., scores in the range of 0.0 to 1.0) to evaluate the transportability, visibility, and observability of the distribution grid 102. The grid management system 200 can be implemented using hardware, software, firmware, or a combination thereof. As an example, a computer system performs the operations of the grid management system 200. The computer system can include one or more processors and computer-readable storage media. Applications and an operating system implemented as computer-readable instructions on the computer-readable storage media can be executed by the one or more processors to provide some or all of the functions described in this document. For example, the computer-readable storage media can include the communication model 204 and the system model 206. The communication model 204 and/or the system model 206 can be loaded from another computer system or another application. Distribution engineers can also generate the communication model 204 and/or the system model 206 on the same computer system that implements the grid management system 200.

To analyze the model observability 232, sensor types, sensor locations, and system connectivity are input to the grid management system 200 as part of the system model 206. This information can be provided by an advanced distribution management system (ADMS) platform or by a combination of utility planning and operations databases. As an example, distribution engineers can operate the grid management system 200 in an application for GridAPPS-D7, which is a standards-based ADMS application development platform.

The grid management system 200 generates the model visibility 234 and the model observability 232. The model visibility 234 quantifies the direct visibility that sensors provide within the system model 206. The model observability 232 quantifies the observability that the sensors offer within the system model 206.

The grid management system 200 determines several intermediate values to generate the model visibility 234 and the model observability 232. These values include a transportability 220, a measurement fraction 224, and an estimation fraction 230.

The transportability 220 generally accounts for communication limitations in the communication system 202. It provides an approximate quantification of the communication system 202 within and connected to the distribution grid 102 without requiring specific identification of deficiencies therein. For example, the transportability 220 takes into account network path redundancy and performance parameters (e.g., channel throughput, latency, packet loss) of the communication system 202. Distribution engineers familiar with the communication system 202 can generally identify this information to analyze the communication model 204 and determine the transportability 220.

The measurement fraction 224 provides a ratio of actual measurements 208 to potential measurements 210. The grid management system 200 identifies the sensor types and sensor locations, which the grid management system 200 can identify in terms of equipment, circuits, nodes, and/or buses within the system model 206. The grid management system 200 uses the sensor information to determine the number of actual measurements 208.

The potential measurements 210 represent the total possible, non-redundant measurements in the system model 206. In other words, the potential measurements 210 indicate the number of state elements that define the grid state of the distribution grid 102. The grid management system 200 determines the measurement fraction 224 by dividing the actual measurements 208 by the potential measurements 210. The grid management system 200 then determines the model visibility 234 of the system model 206 by multiplying the measurement fraction 224 by the transportability 220.

The estimation fraction 230 is the quotient of estimated measurements 212, which are unmeasured state elements that the grid management system 200 can calculate from measurement data, and the potential measurements 210. The grid management system 200 determines the estimated measurements 212 using a symbolic algebra process (e.g., a symbolic Jacobian) in the system model 206. The symbolic Jacobian is a binary matrix that maps measurements to their adjacent buses. In mathematical terms, it describes the set of bus voltages that would be required to calculate the value of a particular state element.

The grid management system 200 generally uses two sets of data to construct the symbolic Jacobian. The first set is system connectivity data. The system connectivity data can come from a network admittance matrix and/or a network connectivity database. If a multi-phase admittance matrix is used, the grid management system 200 can extract bus-to-bus connectivity. The grid management system 200, however, can perform the described systems and techniques using connectivity alone. In other implementations, the grid management system 200 uses the admittance parameter(s) of each connection to estimate states of the system model 206. The second set of data used by the grid management system 200 is sensor types and locations. The grid management system 200 uses this information to map measurements onto the grid states of the system model 206.

The grid management system 200 can also use the symbolic algebra to group the actual measurements 208 and the estimated measurements 212 into islands of observability. Islands of observability include a set of point measurements (e.g., voltages) that can be measured or estimated, which in turn determine other potential measurements 210. The symbolic algebra avoids the need for extensive simulations and efficiently determines the potential measurements 210, even for large distribution grids.

Once it has constructed the symbolic Jacobian, the grid management system 200 can use symbolic algebraic substitution to determine which unknown point measurements can be calculated from the actual measurements 208. The grid management system 200 can identify potential point measurements using substitution based on flow measurement equations. For example, if the voltage at one endpoint of a flow-sensor measurement is known, the voltage at the other endpoint can be estimated. Similarly, the grid management system 200 can identify current or power values at a node using substitution based on single-adjacent-bus injection measurement. As an example, current or power injected into a bus with only one adjacent bus (or one adjacent bus with an unknown flow value) can be treated as flowing from the injection bus to the adjacent bus. The grid management system 200 can also identify bus voltages using simplification based on multiple-adjacent-bus injections measurements. For example, sets of adjacent bus injections can be analyzed for solvable subsystems including the same number of measurement equations as unknown bus voltages.

Once it has performed the symbolic algebra, the grid management system 200 can determine the estimated measurements 212. The estimated measurements 212 can include point measurements (e.g., bus voltage) if the associated bus is a member of an island of observability; flow measurements (e.g., bus current, bus power) if the buses on the ends are members of any island of observability; or injection measurements (e.g., power, current) if the adjacent buses are members of any island of observability. The grid management system 200 calculates the estimation fraction 230 by dividing the estimated measurements 212 by the potential measurements 210. The grid management system 200 then determines the model observability 232 by multiplying the estimation fraction 230 by the transportability 220.

The grid management system 200 quantifies the observability of the distribution grid 102 by calculating the model visibility 234 and the model observability 232. Using the islands of observability, the grid management system 200 and/or distribution engineers can also identify the regions of the distribution grid 102 wherein the observability is deficient. Distribution engineers, using the grid management system 200, can incrementally change the sensor allocation of the system model 206 to observe changes in the model observability 232. The grid management system 200 can implement an optimization engine or pre-programmed sensor allocation strategies to automate the process of identifying an ideal sensor-allocation plan. In particular, distribution engineers can use the grid management system 200 to maximize the model observability 232 for a fixed sensor cost or minimize sensor cost for a target model observability.

Figure 3:
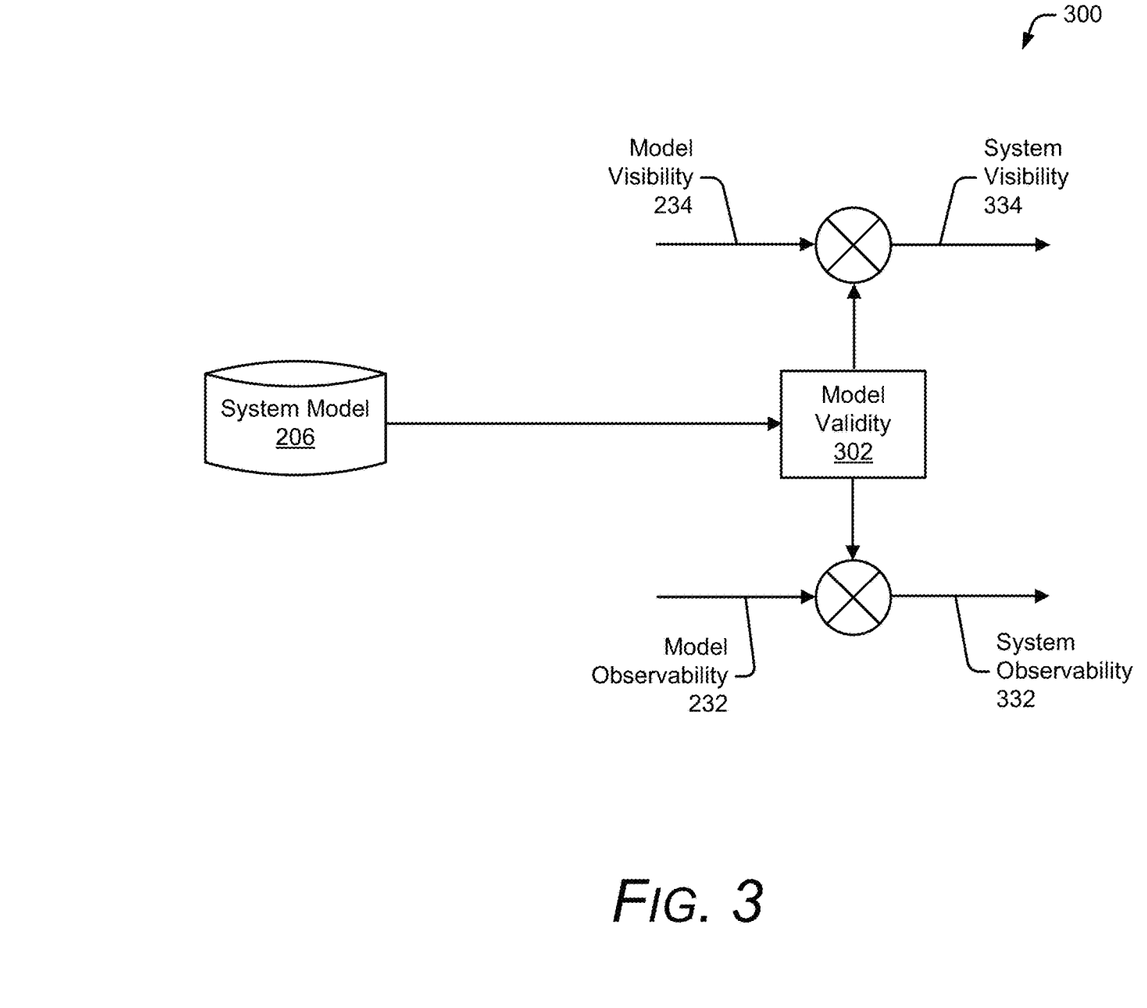
FIG. 3 is a high-level flow chart of a grid management system to evaluate and improve a system visibility and a system observability of a distribution grid.

FIG. 3 illustrates a high-level flow chart of a grid management system 300 to generate and evaluate a system visibility 334 and a system observability 332 of the distribution grid 102. The grid management system 300, which can be the grid management system 200 of FIG. 2, provides distribution engineers an estimate of the accuracy of the system model 206 using a model validity 302. The system visibility 334 quantifies the visibility that the sensors provide within the distribution grid 102. The system observability 332 quantifies the observability that the sensors provide within the distribution grid 102.

The model visibility 234 and the model observability 232 assume the system model 206 provides a perfect representation of the distribution grid 102 (e.g., an index value of 1.0). The model validity 302 accounts for inaccuracies in the system model 206 without requiring distribution engineers to identify and detail these inaccuracies specifically. The model validity 302 can be obtained from or generated by distribution engineers for the distribution grid 102. Distribution engineers can usually characterize an approximate value of the model validity 302 for a respective distribution grid 102. As an example, the model validity 302 generally falls within the 0.6 to 0.8 range for distribution grids. In this manner, the model validity 302 provides an approximate, but relatively accurate, representation of deficiencies in the system model 206.

The model validity 302 modifies the model visibility 234 and the model observability 232 to generate the system visibility 334 and the system observability 332. In particular, the grid management system 300 multiplies the model visibility 234 by the model validity 302 to calculate the system visibility 334. Similarly, the grid management system 300 multiplies the model observability 232 by the model validity 302 to determine the system observability 332. Although the model validity 302 does not provide an exact value for the system visibility 334 and the system observability 332, it offers sufficient granularity to generate a sensor-allocation plan.

Example Observability Analysis

Figure 4:
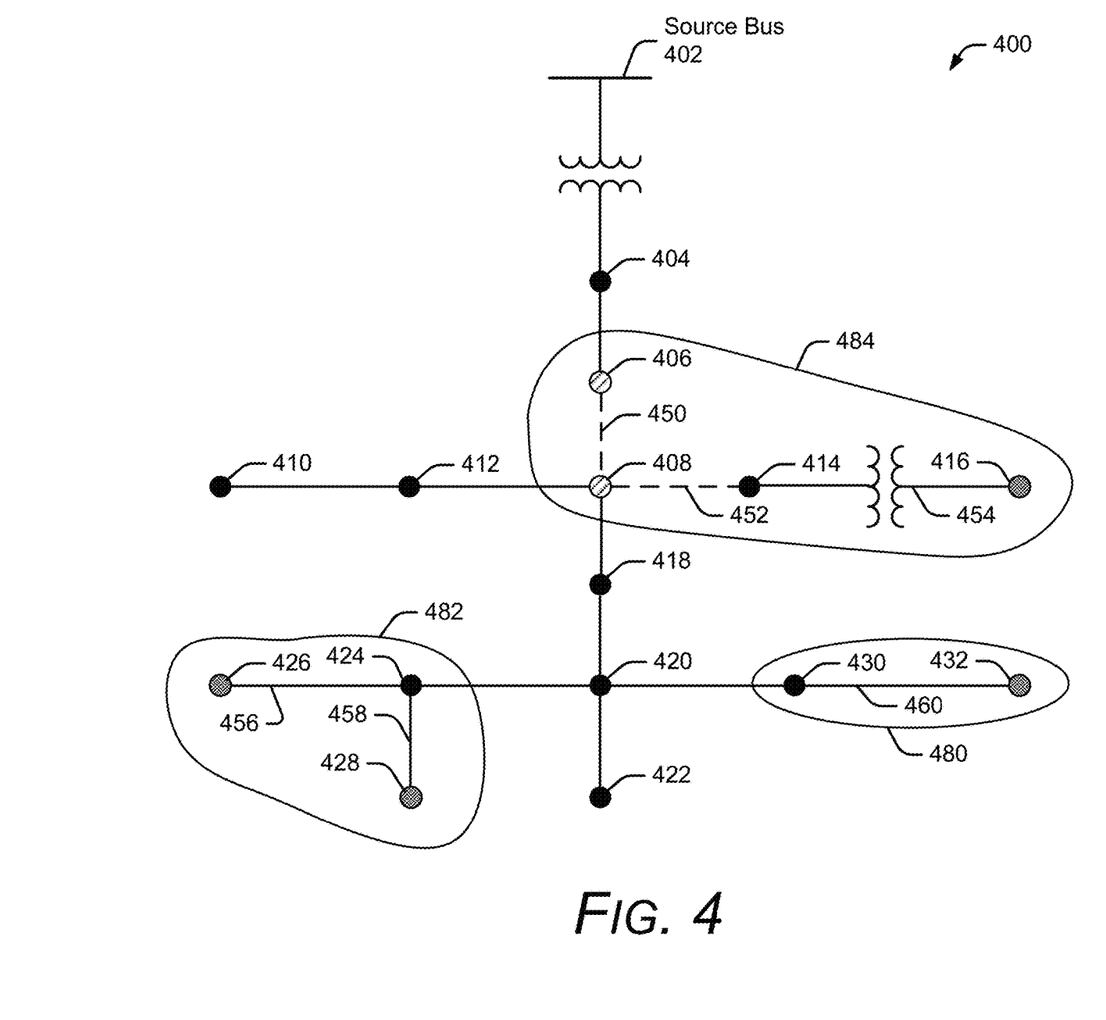
FIG. 4 illustrates an example system model of a distribution grid.

FIG. 4 illustrates an example system model 400 of the distribution grid 102. Distribution engineers can use the described systems and techniques to identify the visibility and observability of the system model 400 and the distribution grid 102. In other words, distribution engineers can use the system model 400 to establish a base case for the distribution grid 102.

The system model 400 assumes that the distribution grid 102 has a transportability of 1.0. An index value of 1.0 for the transportability indicates that there are no losses in the transmission of sensor data to distribution engineers of the distribution grid 102. As described above, the transportability can be determined analyzing a communication model (e.g., the communication model 204 of FIG. 2) or estimated based on input from distribution engineers that are familiar with the communication system (e.g., the communication system 202) of the distribution grid 102. The system model 400 also assumes that the model validity is 0.93, which correlates to the system model 400 being approximately 93% accurate in modeling the distribution grid 102.

The system model 400 includes a source bus 402 and nodes 404-432. The nodes 404, 414, 422, and 424 are unloaded unmeasured nodes. The nodes 410, 412, 418, 420, and 430 are loaded unmeasured nodes. No sensor data is available for the unmeasured nodes 404, 410, 412, 414, 418, 420, 422, 424, and 430 in the system model 400. The unmeasured nodes are illustrated as black, solid-filled nodes in FIG. 4.

The system model 400 includes six point-measurement sensors at the nodes 406, 408, 416, 426, 428, and 432. In this implementation, the point-measurement sensors obtain a voltage reading. The nodes 416, 426, 428, and 432 also include an injection-measurement sensor to obtain a current reading. In FIG. 4, the voltage-only point-measurements are illustrated as hatched nodes, and the voltage and current point-measurements are illustrated as black, cross-hatched nodes.

The system model 400 also includes two flow sensors. The flow sensors obtain current-flow or power-flow readings at the buses 450 and 452. The flow sensors are illustrated as dashed lines in FIG. 4.

The measurement fraction of the system model 400 is 0.255. A measurement fraction of 0.255 indicates that approximately 25% of the nodes and buses in the distribution grid 102 have measurement data available. As discussed above, the system model 400 includes six point-measurement sensors (e.g., at the nodes 406, 408, 416, 426, 428, and 432), four injection-measurement sensors (e.g., at the nodes 416, 426, 428, and 432), and two flow-measurement sensors (e.g., at the buses 450 and 452). The system model 400 and the distribution grid 102 include 47 potential measurements: 16 potential point measurements, 16 potential injection measurements, and 15 flow measurements. With a transportability index of 1.0, the system model 400 has a model visibility index of 0.255 (e.g., 1.0 visibility index×(12 actual measurements÷47 potential measurements)). With a model validity of 0.93, the system visibility index of the distribution grid 102 is approximately 0.237 (e.g., 0.255 model visibility×0.93 model validity).

The estimation fraction of the system model 400 is 0.17 (e.g., 8 estimated measurements÷47 potential measurements). The distribution grid 102 includes eight measurement points that can be estimated based on actual sensor measurements. In this implementation, a point measurement at the node 414 can be estimated based on the point measurement at node 408 and the flow measurement at bus 452. Injection measurements at the nodes 414, 424, and 430 can be estimated using substitution based on the adjacent-bus injection measurements of the nodes 408 and 416, the nodes 426 and 428, and the node 432, respectively. In addition, flow measurements at the buses 454, 456, 458, and 460 can be estimated based on the injection measurements at the nodes 416, 426, 428, and 432, respectively.

For the system model 400, the estimation fraction of 0.17 is summed with the measurement fraction of 0.255 and multiplied by the transportability index to determine a model observability index of 0.425. The model observability index is then multiplied by the model validity of 0.93, which results in a system observability index of 0.396 for the distribution grid 102.

In the system model 400 of FIG. 4, three islands of observability 480, 482, and 484 exist around the actual measurements of the distribution grid 102. The center and some extremities of the system model 400 are not part of the islands of observability 480, 482, and 484 because there are no nearby actual measurements. The islands of observability 480, 482, and 484 provide a graphical representation of the observability of the distribution grid 102. This graphical representation can be used by distribution engineers as discussed below with respect to FIG. 5 to determine the number and locations of sensors to add to the distribution grid 102 to improve its system observability.

Figure 5:
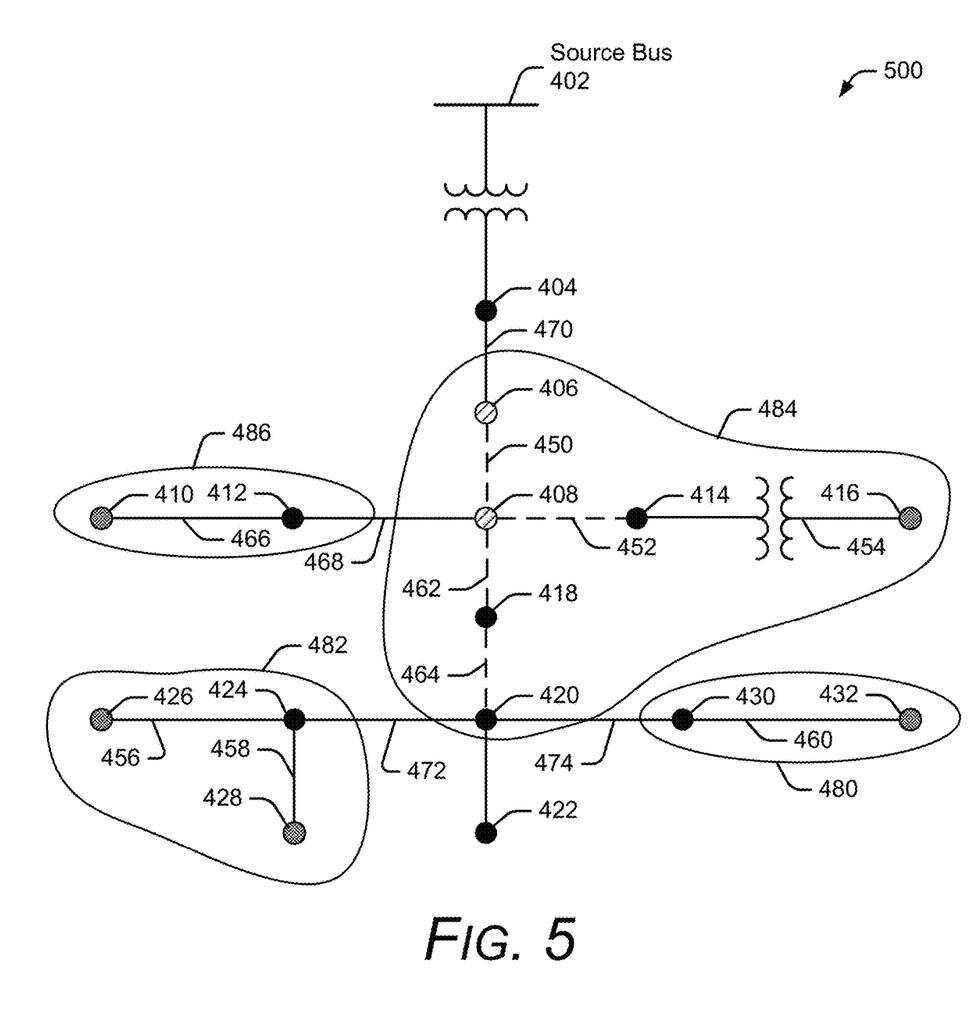
FIG. 5 illustrates an example system model of a distribution grid with improved visibility and observability.

FIG. 5 illustrates a system model 500 of the distribution grid 102 with improved visibility and observability. The system model 500 is used to improve the system visibility and the system observability of the distribution grid 102 by adding new sensors. As described below, a small increase in the number of actual measurements results in a substantial increase in the system observability of the distribution grid 102.

The system model 500 is similar to the system model 400 of FIG. 4 but includes four additional sensor measurements. In particular, a new point-measurement sensor and a new injection-measurement sensor are added at the node 410. Two new flow-measurement sensors are also added at buses 462 and 464.

The additional sensor measurements result in a new island of observability 486, which encompasses node 410, node 412, and a bus 466. The island of observability 484 is enlarged to include the nodes 418 and 420.

In the system model 500, the measurement fraction has slightly increased from 0.255 to 0.34 (e.g., 16 actual measurements÷47 potential measurements). The larger measurement fraction results from the new point measurement at the node 410, the new injection measurement at the node 410, and the new flow measurements at the buses 462 and 464. The model visibility is 0.34 (e.g., 0.34 measurement fraction×1.0 transportability) and the system visibility is 0.3176 (e.g., 0.34 model visibility×0.93 model validity).

The estimation fraction for the system model 500 is 0.426 (e.g., 20 estimated measurements÷47 potential measurements). The four new sensor measurements increased the number of estimated measurements from eight to 20. In particular, voltage and current measurements can be estimated at the nodes 418 and 420, current measurements can be estimated at the nodes 406, 408, and 412, and flow measurements can be estimated at buses 466, 468, 470, 472, and 474. Factoring in the measurement fraction and the transportability, the system model 500 has a model observability of 0.766 (e.g., 1.0 transportability×(0.34 measurement fraction+0.426 estimation fraction)) and a system observability of 0.712 (e.g., 0.766 model observability×0.93 model validity).

The system visibility of the system model 500 increased by 0.085, which is an increase of approximately 33%. The system observability increased by 0.34, which is an increase of about 80%. As depicted by system model 500, a small increase in the number of sensors and their strategic placement can result in significant improvements in the system observability of the distribution grid 102.

Example Method

Figure 6:
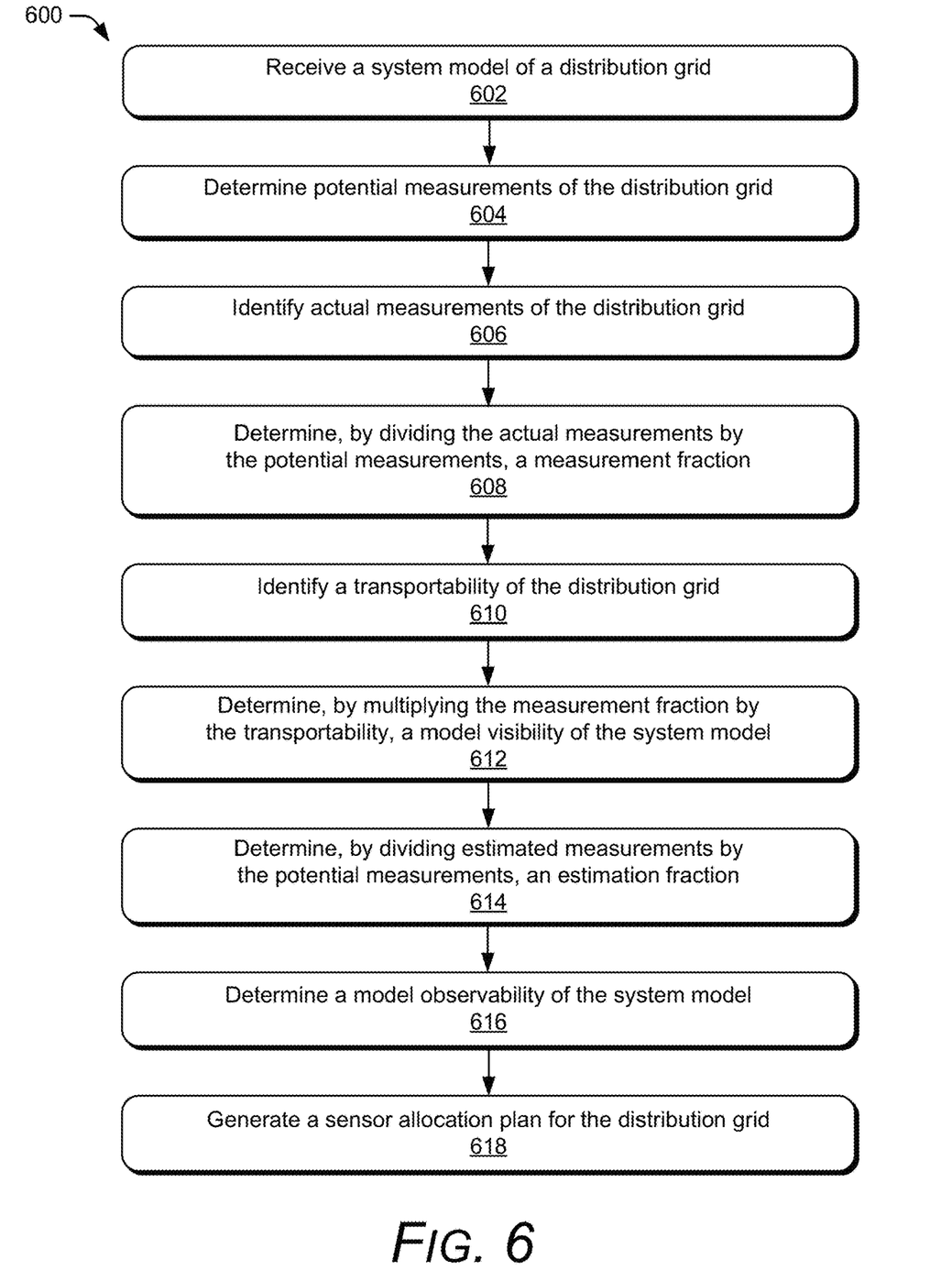
FIG. 6 illustrates an example method for determining sensor allocation in a distribution grid.

FIG. 6 illustrates an example method 600 for determining sensor allocation in a distribution grid. The series of operational blocks 602-618 that describe the method 600 are not to be construed as a limitation, as one or more of the described operational blocks 602-618 can be combined using different elements or ordering to implement the method 600 or an alternate, derivative method. In addition, one or more of the operations blocks 602-618 can be omitted from the method 600. Furthermore, although described in the context of being performed by or via a computer system, portions of the method 600 may be divided or allocated across multiple computer systems. The method 600 may use elements of FIGS. 1-5.

At 602, a system model of a distribution grid is received by a grid management system. The system model provides a representation of circuits, sensors, and locations of sensors within the distribution grid. For example, the system model 400, which provides a representation of the distribution grid 102, is received by the grid management system 200. The system model 400 includes the following circuits: the source bus 402 and the nodes 404-432. The system model 400 also includes six point-measurement sensors at the nodes 406, 408, 416, 426, 428, and 432. Voltage readings are obtained by the point-measurement sensors. The nodes 416, 426, 428, and 432 in the system model 400 also include injection-measurement sensors. Current or power readings are obtained by the injection-measurement sensors. The system model 400 also includes two flow sensors at the buses 450 and 452 that obtain current-flow or power-flow measurements.

At 604, potential measurements of the distribution grid are determined from the system model. For example, the distribution grid 102, as illustrated in FIGS. 4 and 5, has 47 potential measurements. In particular, the distribution grid 102 includes 16 nodes, at which both a point measurement and an injection measurement are possible, and 15 buses, at which flow measurements are possible.

At 606, actual measurements of the distribution grid are identified based on the sensors and the locations of the sensors. The actual measurements can include at least one of a point measurement, a flow measurement, or an injection measurement. For example, the distribution grid 102, as illustrated by the system model 400 of FIG. 4, includes six point-measurement sensors (e.g., at the nodes 406, 408, 416, 426, 428, and 432), four injection-measurement sensors (e.g., at the nodes 416, 426, 428, and 432), and two flow-measurement sensors (e.g., at the buses 450 and 452). In other words, the distribution grid 102 includes 12 actual measurements.

At 608, a measurement fraction is determined by dividing the actual measurements by the potential measurements. For example, the measurement fraction of the system model 400 is 0.255, which is obtained by dividing the 12 actual measurements by the 47 potential measurements.

At 610, a transportability of the distribution grid is identified. The transportability comprises an index value of a capability of the distribution grid to deliver measurement data. For example, the distribution grid 102 has a transportability of 1.0. An index value of 1.0 for the transportability indicates that there are no losses in transmission of measurement data to distribution engineers of the distribution grid 102.

At 612, a model visibility of the system model is determined by multiplying the measurement fraction by the transportability. The model visibility comprises an index value of a capability to obtain useable data in the distribution grid. For example, the system model 400 has a model visibility of 0.255, which is determined by multiplying the measurement fraction of 0.255 by the transportability of 1.0.

At 614, an estimation fraction is determined by dividing estimated measurements by the potential measurements. The estimated measurements comprise unmeasured points of the potential measurements that can be estimated using the actual measurements. For example, the distribution grid 102 includes eight measurement points that can be estimated based on actual measurements. For the distribution grid 102, a voltage measurement at the node 414 can be estimated based on the voltage measurement at the node 408 and the flow measurement at bus 452. Current measurements at the nodes 414, 424, and 430 can be estimated using substitution based on the adjacent-bus current measurements of the nodes 408 and 416, the nodes 426 and 428, and the node 432, respectively. In addition, flow measurements at the buses 454, 456, 458, and 460 can be estimated based on the current measurements at the nodes 416, 426, 428, and 432, respectively. The estimation fraction of the distribution grid 102 is 0.17, which is determined by dividing the 8 estimated measurements by the 47 potential measurements.

At 616, a model observability of the system model is determined by multiplying the transportability by a sum of the measurement fraction and the estimation fraction. The model observability comprises a capability to combine the actual measurements and the estimated measurements to determine operating parameters for the distribution grid. For example, the sum of the measurement fraction (e.g., 0.255) and the estimation fraction (e.g., 0.17) for the system model 400 is 0.425. The model observability of the system model 400 is 0.425 (e.g., 1.0 transportability×0.425).

At 618, a sensor allocation plan for the distribution grid is generated using the model visibility and the model observability. The sensor allocation plan indicates one or more new sensors and locations of the one or more new sensors within the distribution grid. For example, the system model 500 includes four additional sensor measurements that are not included in the system model 400. In particular, a new point-measurement sensor and a new injection-measurement sensor are added at the node 410, and two new flow-measurement sensors are added at buses 462 and 464. The additional actual measurements increase the measurement fraction of the system model 500 from 0.255 to 0.34, which results in a model visibility of 0.34 and a system visibility of 0.3166 for the system model 500. The new sensor measurements also increase the model observability of the system model 500 from 0.425 to 0.766. Similarly, the system observability of the system model 500 increases from 0.396 to 0.712. By iteratively placing new sensors in the system model 500, distribution engineers of the distribution grid 102 can generate a sensor allocation plan using the model visibility and model observability of the system model 500 in comparison to the system model 400.

The foregoing detailed description provides exemplary embodiments of the invention and includes the best mode for practicing the invention. The description and illustration of these embodiments are intended only to provide examples of the invention, and not to limit the scope of the invention, or its protection, in any manner.

What is claimed is:

1. A method for sensor allocation in a distribution grid, the method comprising:
   receiving a system model of the distribution grid, wherein the system model provides a representation of circuits, sensors, and locations of the sensors within the distribution grid;
   determining, from the system model of the distribution grid, potential measurements of the distribution grid;
   identifying, based on the sensors and the locations of the sensors in the system model, actual measurements of the distribution grid, the actual measurements including at least one of a point measurement, a flow measurement, or an injection measurement;
   determining, by dividing the actual measurements by the potential measurements, a measurement fraction;
   identifying a transportability of the distribution grid, wherein the transportability comprises an index value of a capability of the distribution grid to deliver measurement data;
   determining, by multiplying the measurement fraction by the transportability, a model visibility of the system model, wherein the model visibility comprises an index value of a capability to obtain useable data in the distribution grid;
   determining, by dividing estimated measurements by the potential measurements, an estimation fraction, wherein the estimated measurements comprise unmeasured points of the potential measurements that can be estimated using the actual measurements;
   determining, by multiplying the transportability by a sum of the measurement fraction and the estimation fraction, a model observability of the system model, wherein the model observability comprises a capability to combine the actual measurements and the estimated measurements to determine operating parameters for the distribution grid; and
   generating, using the model visibility and the model observability, a sensor allocation plan for the distribution grid, wherein the sensor allocation plan indicates one or more new sensors and locations of the one or more new sensors to be placed within the distribution grid.

2. The method of claim 1, the method further comprising:
identifying, using symbolic algebraic substitution, the estimated measurements,
wherein estimated point measurements are estimated using at least one of a flow measurement or adjacent injection measurements, and
wherein estimated injection measurements are estimated using an adjacent injection measurement.

3. The method of claim 2, the method further comprising:
identifying, based on the symbolic algebraic substitution, islands of observability,
wherein the islands of observability comprise areas of the distribution grid where point measurements are possible for circuits therein.

4. The method of claim 1, the method further comprising:
identifying a model validity of the system model, wherein the model validity comprises an index value of an accuracy of the system model; and
determining, by multiplying the model visibility and the model observability by the model validity, a system visibility and a system observability, respectively, of the distribution grid.

5. The method of claim 4, wherein the sensor allocation plan is effective to maximize the system observability for at least one of a fixed sensor cost or minimize a sensor cost for a predetermined system observability.

6. The method of claim 4, wherein the transportability of the distribution grid, the model visibility of the system model, the model observability of the system model, the model validity of the system model, the system visibility of the distribution grid, and the system observability of the distribution grid comprise a numerical value between zero and one.

7. The method of claim 1, the method further comprising generating the system model of the distribution grid.

8. The method of claim 1, wherein the point measurement and the injection measurement comprise measurements taken at a node of the distribution grid and the flow measurement comprises a measurement taken between nodes of the distribution grid.

9. The method of claim 8, wherein the point measurement includes a voltage measurement taken at a node of the distribution grid, the flow measurement includes a measurement of at least one of a current flow or a power flow between nodes of the distribution grid, and the injection measurement includes at least one of a current measurement or a power measurement taken at a node of the distribution grid.

10. The method of claim 1, wherein the transportability of the distribution grid accounts for at least one of network path redundancies, channel throughput, latencies, and packet losses of the distribution grid.

11. A computer-readable storage media comprising computer-executable instructions for analyzing sensor allocation in a distribution grid, the computer-executable instructions, when executed, cause one or more processors of a computer system to:
determine, from a system model of the distribution grid, potential measurements of the distribution grid, wherein the system model provides a representation of circuits, sensors, and locations of sensors within the distribution grid;
count, based on the sensors and the locations of the sensors in the system model, actual measurements of the distribution grid, the actual measurements including at least one of a point measurement, a flow measurement, or an injection measurement;
determine, by dividing the actual measurements by the potential measurements, a measurement fraction;
receive an input of a transportability of the distribution grid, wherein the transportability comprises an index value of a capability of the distribution grid to deliver measurement data;
determine, by multiplying the measurement fraction by the transportability, a model visibility of the system model, wherein the model visibility comprises an index value of a capability to obtain useable data in the distribution grid;
determine, by dividing estimated measurements by the potential measurements, an estimation fraction, wherein the estimated measurements comprise unmeasured points of the potential measurements that can be estimated using the actual measurements;
determine, by multiplying the transportability by a sum of the measurement fraction and the estimation fraction, a model observability of the system model, wherein the model observability comprises a capability to combine the actual measurements and the estimated measurements to determine operating parameters for the distribution grid; and
generate, using the model visibility and the model observability, a sensor allocation plan for the distribution grid, wherein the sensor allocation plan indicates one or more new sensors and locations of the one or more new sensors within the distribution grid.

12. The computer-readable storage media of claim 11, wherein the computer-executable instructions, when executed, further cause the one or more processors of the computer system to identify, using symbolic algebraic substitution, the estimated measurements, wherein estimated point measurements are estimated using a flow measurement or adjacent injection measurements and estimated injection measurements are estimated using an adjacent injection measurement.

13. The computer-readable storage media of claim 12, wherein the computer-executable instructions, when executed, further cause the one or more processors of the computer system to identify, based on the symbolic algebraic substitution, islands of observability, wherein the islands of observability comprise areas of the distribution grid where point measurements are possible for circuits therein.

14. The computer-readable storage media of claim 11, wherein the computer-executable instructions, when executed, further cause the one or more processors of the computer system to:
receive an input of a model validity of the system model, wherein the model validity comprises an index value of an accuracy of the system model; and
determine, by multiplying the model visibility and the model observability by the model validity, a system visibility and a system observability, respectively, of the distribution grid.

15. The computer-readable storage media of claim 14, wherein the sensor allocation plan is effective to at least one of maximize the system observability for a fixed sensor cost or minimize a sensor cost for a predetermined system observability.

16. The computer-readable storage media of claim 14, wherein the transportability of the distribution grid, the model visibility of the system model, the model observability of the system model, the model validity of the system model, the system visibility of the distribution grid, and the system observability of the distribution grid comprise a numerical value between zero and one.

17. The computer-readable storage media of claim 11, wherein the computer-executable instructions, when executed, further cause the one or more processors of the computer system to generate the system model of the distribution grid.

18. The computer-readable storage media of claim 11, wherein the point measurement and the injection measurement comprise measurements taken at a node of the distribution grid and the flow measurement comprises a measurement taken between nodes of the distribution grid.

19. The computer-readable storage media of claim 18, wherein the point measurement includes a voltage measurement taken at a node of the distribution grid, the flow measurement includes a measurement of at least one of current flow or power flow between nodes of the distribution grid, and the injection measurement includes at least one of a current measurement or a power measurement taken at a node of the distribution grid.

20. The computer-readable storage media of claim 11, wherein the transportability of the distribution grid accounts for at least one of network path redundancies, channel throughput, latencies, or packet losses of the distribution grid.

* * * * *